US009601419B1

(12) United States Patent
Toong et al.

(10) Patent No.: US 9,601,419 B1
(45) Date of Patent: Mar. 21, 2017

(54) STACKED LEADFRAME PACKAGES

(71) Applicant: Altera Corporation, San Jose, CA (US)

(72) Inventors: Teik Tiong Toong, Simpang Ampat (MY); Chong Poh Lim, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 33 days.

(21) Appl. No.: 14/298,230

(22) Filed: Jun. 6, 2014

(51) Int. Cl.
*H01L 23/48* (2006.01)
*H01L 23/495* (2006.01)
*H01L 25/065* (2006.01)
*H01L 25/00* (2006.01)

(52) U.S. Cl.
CPC .... *H01L 23/49575* (2013.01); *H01L 25/0657* (2013.01); *H01L 25/50* (2013.01)

(58) Field of Classification Search
CPC H01L 23/49575; H01L 25/0657; H01L 25/50
See application file for complete search history.

(56) References Cited

U.S. PATENT DOCUMENTS

| 5,403,784 | A |   | 4/1995  | Hashemi et al. |            |
|-----------|---|---|---------|----------------|------------|
| 5,569,625 | A |   | 10/1996 | Yoneda et al.  |            |
| 5,625,221 | A | * | 4/1997  | Kim            | H01L 25/105 |
|           |   |   |         |                | 257/685    |
| 5,739,581 | A | * | 4/1998  | Chillara       | H01L 25/0657 |
|           |   |   |         |                | 257/668    |
| 6,443,179 | B1| * | 9/2002  | Benavides      | F15C 5/00  |
|           |   |   |         |                | 137/454.2  |
| 6,518,659 | B1| * | 2/2003  | Glenn          | H01L 23/043 |
|           |   |   |         |                | 257/686    |
| 7,071,545 | B1| * | 7/2006  | Patel          | H01L 23/3135 |
|           |   |   |         |                | 257/686    |
| 7,388,280 | B2|   | 6/2008  | Shim et al.    |            |
| 7,446,396 | B2|   | 11/2008 | Yim            |            |
| 7,679,169 | B2|   | 3/2010  | Yim            |            |
| 7,786,595 | B2|   | 8/2010  | Shen et al.    |            |
| 8,125,064 | B1| * | 2/2012  | Lee            | H01L 23/13 |
|           |   |   |         |                | 257/684    |
| 8,169,061 | B2|   | 5/2012  | Shen et al.    |            |
| 8,207,603 | B2|   | 6/2012  | Shen et al.    |            |
| 8,212,347 | B2|   | 7/2012  | Shen et al.    |            |
| 2005/0133897 | A1| * | 6/2005 | Baek         | H01L 23/4951 |
|           |   |   |         |                | 257/686    |

(Continued)

*Primary Examiner* — Nicholas Tobergte
(74) *Attorney, Agent, or Firm* — Treyz Law Group; Jason Tsai

(57) ABSTRACT

A multi-package unit having stacked packages is provided. A multi-package unit may include a first package and a second package mounted on the first package. The first package may be a leadframe package that includes metal leads extending beyond the perimeter of the first package. The first package may include a first integrated circuit die assembled within the first package using the wirebond configuration or the flip-chip configuration. The second package may be a leadframe package or a leadless package that includes a second integrated circuit die. The second package may be smaller than the first package. The first and second integrated circuit dies may be formed using different integrated circuit fabrication technologies.

13 Claims, 6 Drawing Sheets

(56) References Cited

U.S. PATENT DOCUMENTS

| | | | | |
|---|---|---|---|---|
| 2006/0220210 A1* | 10/2006 | Karnezos | ............ | H01L 23/3135 257/686 |
| 2007/0218689 A1* | 9/2007 | Ha | .......................... | H01L 25/03 438/686 |
| 2008/0224285 A1* | 9/2008 | Lim | .................... | H01L 23/4334 257/675 |
| 2009/0166835 A1* | 7/2009 | Yang | .................... | H01L 21/565 257/686 |
| 2009/0236718 A1* | 9/2009 | Yang | ...................... | H01L 25/03 257/686 |
| 2009/0243069 A1* | 10/2009 | Camacho | .......... | H01L 23/49531 257/686 |
| 2010/0025830 A1* | 2/2010 | Camacho | ............ | H01L 21/4828 257/677 |
| 2010/0123227 A1* | 5/2010 | Dahilig | ................ | H01L 21/565 257/675 |
| 2011/0133325 A1* | 6/2011 | Moon | ................ | H01L 23/3128 257/686 |

* cited by examiner

STACKED LEADFRAME PACKAGES

BACKGROUND

An integrated circuit package generally includes, among others, an integrated circuit die and a substrate on which the die is mounted. The die is typically coupled to the substrate through wires or solder bumps. Signals from the integrated circuit die may then travel through the wires or solder bumps to the substrate.

Integrated circuit packages are typically mounted on a printed circuit board. In an effort to reduce the size of the printed circuit board, integrated circuit packages are sometimes stacked vertically with respect to one another. Stacking one package on top of another package can substantially reduce the required surface area on a printed circuit board and can reduce the routing complexity between the different components on the printed circuit board.

In conventional integrated circuit systems, only ball grid array (BGA) packages have been implemented for stacking. For example, a first BGA package can be mounted on a second BGA package. Solder balls are formed between the first and second BGA packages to ensure proper connection between the integrated circuit die within the first BGA package and the integrated circuit die within the second BGA package. Thus far, stacking for other types of packages such as leadframe packages have not yet been implemented.

It is within this context that the embodiments described herein arise.

SUMMARY

An integrated circuit (IC) system having a multi-package unit is provided. The multi-package unit may be mounted on a printed circuit board. The multi-package unit may include a first IC package and a second IC package mounted on top of the first IC package.

The first IC package may be a leadframe package (e.g., a package having protruding metal leads that extend beyond the perimeter of that package). The second IC package should be smaller than the first IC package. The first IC package may include an integrated circuit die mounted in a wirebond configuration or a flip-chip configuration. When mounted in the flip-chip configuration, the first package may include an interposer to which the die is mounted to facilitate communication between the die and circuitry external to the first package.

The first IC package may have a bottom surface that faces the printed circuit board and a top opposing surface in which exposed contact pads are formed. The second IC package should have a landing pattern that matches the exposed contact pads at the top surface of the first package. The integrated circuit die may be coupled to the leads via first conductive paths and may be coupled to the exposed contact pads via second conductive paths. If desired, the exposed contact pads may be coupled to the leads via third conductive paths.

The first and second IC packages may be manufactured separately and tested prior to being assembled together. Doing so allows the integrated circuit die in each of the stacked packages to be implemented using the most appropriate technology process and can help increase yield.

Further features of the present invention, its nature and various advantages will be more apparent from the accompanying drawings and the following detailed description.

DETAILED DESCRIPTION

Embodiments of the present invention relate to multi-package units and, more particularly, to multi-package units formed using leadframe packages. A multi-package unit may include different packages (e.g., packages stacked on top of one another), each of which includes an integrated circuit device that can communicate with another integrated circuit device in the multi-package unit.

Figure 1:
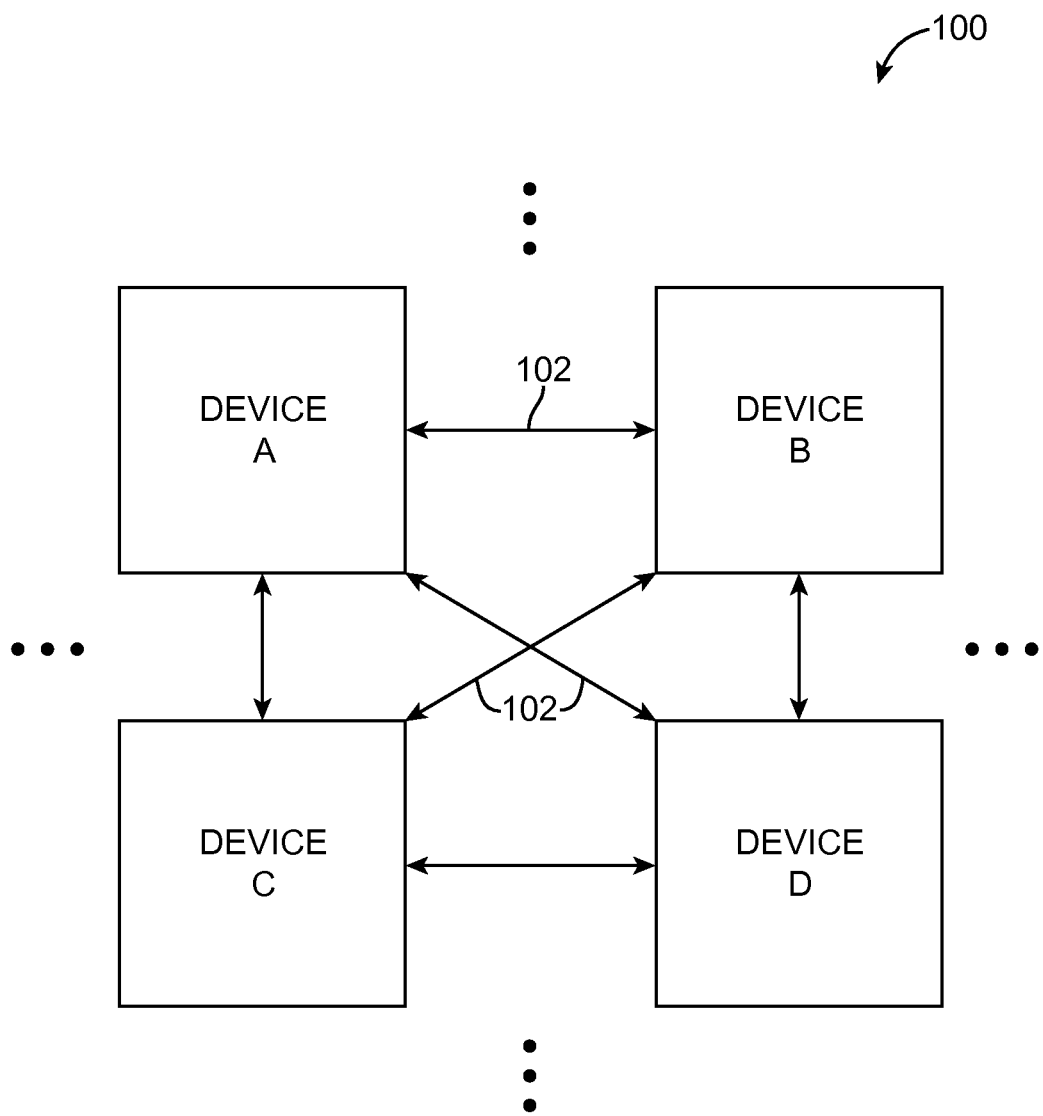
FIG. 1 is a diagram of illustrative interconnected electronic devices that may communicate with one another via conductive traces in accordance with an embodiment of the present invention.

An illustrative system 100 of interconnected electronic devices is shown in FIG. 1. The system of interconnected electronic devices may have multiple electronic devices such as device A, device B, device C, device D, and interconnection resources 102.

Interconnection resources 102 such as conductive lines and busses, optical interconnect infrastructure, or wired and wireless networks with optional intermediate switching circuitry may be used to send signals from one electronic device to another electronic device or to broadcast information from one electronic device to multiple other electronic devices. For example, a transmitter in device B may transmit data signals to a receiver in device C. Similarly, device C may use a transmitter to transmit data to a receiver in device B.

The electronic devices may be any suitable type of electronic device that communicates with other electronic devices. Examples of such electronic devices include basic electronic components and circuits such as analog circuits, digital circuits, mixed-signal circuits, circuits formed within a single package, circuits housed within different packages, circuits that are interconnected on a printed-circuit board (PCB), etc.

In some arrangements, electronic devices A-D are integrated circuits. Integrated circuits A-D may be assembled in different ways. For example, these integrated circuits may be in different packages, in the same packages, stacked with wirebond connections or flip-chip connections, or assembled using through-silicon-vias (TSV), just to name a few.

Figure 2:
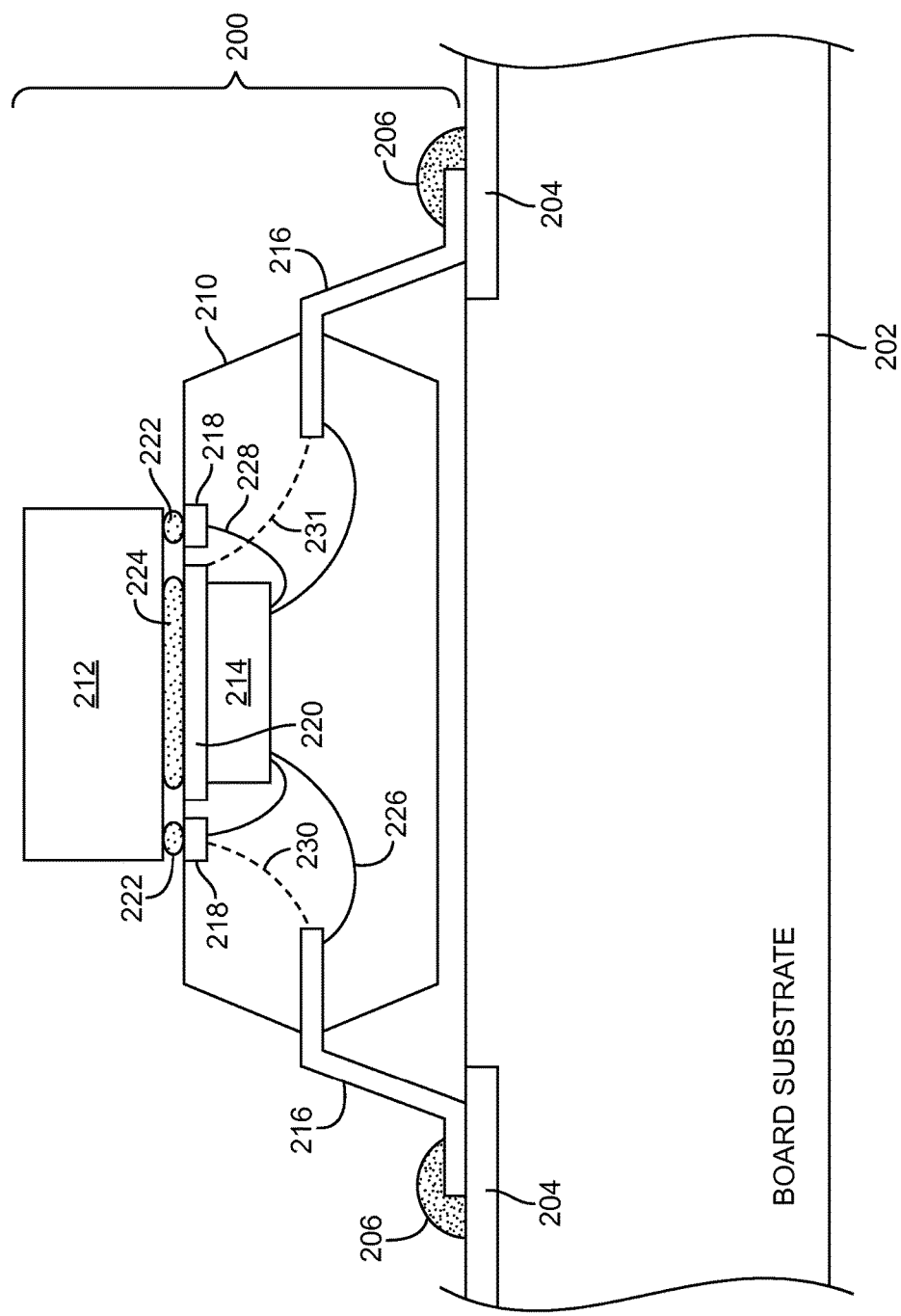
FIG. 2 is a cross-sectional side view of a multi-package unit that includes a top package stacked on a bottom leadframe package in accordance with an embodiment of the present invention.

In accordance with an embodiment of the present invention, FIG. 2 shows an integrated circuit system that includes a multi-package unit 200 mounted on a board substrate such as printed circuit board (PCB) 202. Multi-package unit 200 may include at least two packages that are stacked vertically with respect to each other. Unit 200 formed in this way may sometimes be referred to as a module with stacked packages or a package-on-package (POP) unit.

As shown in FIG. 2, multi-package unit 200 may include a first (bottom) package 212 and a second (top) package 212 that is stacked on top of bottom package 212. Package 210 may be a type of package sometimes referred to as a quad-flat package (QFP). A QFP is a surface mount integrated circuit package that may be provided with "gull wing" leads that extend from each of the four sides of the package. Package 210 may include leads 216 that extend from beyond the perimeter of package 210 and that make physical contact with conductive pads 204 formed on PCB 202. Solder material 206 may be formed on pads 204 to ensure proper electrical connection between leads 216 and each of the respective pads 204.

Leads 216 may also have multiple bends so that when leads 216 are in contact with PCB 202, the leads prop package 210 above the surface of the PCB so that the bottom surface of package 210 is not in direct contact with the top surface of the PCB. This is merely illustrative. If desired, the bottom surface of package 210 may be allowed to make direct contact with the surface of PCB 202 for additional mechanical support.

Conductive pads may be formed on the top surface of package 210. In the example of FIG. 2, a center conductive pad 220 and multiple smaller conductive pads 218 surrounding the center conductive pad 220 may be formed at the top surface of package 210. Pads 218 and 220 formed in the surface of package 210, which can be used to formed active connections with circuitry mounted on top of package 210, are sometimes referred to as "exposed" contact pads. In general, it is desirable to implement the bottom package 210 using types of packages that allow for exposed pads to be formed at the top surface to enable stacking of packages.

An integrated circuit die such as integrated circuit 214 may be formed within package 210. Integrated circuit 214 may include active circuits such as transistors formed in a substrate and may have a front side and a back side. The front side of integrated circuit 214 represents the side at which transistors and associated interconnect routing paths can be formed, whereas the back side of integrated circuit 214 represents the side of the substrate. Integrated circuit 214 may be assembled in a wirebond configuration in which the back side of integrated circuit 214 is attached to center conductive region 220 and in which the front side of integrated circuit 214 is coupled to external circuitry via conductive routing paths formed within package 210. Since only the backside of die 214 is in direct contact with pad 220, there is no direct electrical connection between the substrate of die 214 and pad 220.

Circuitry formed in the front side of die 214 may be at least coupled to leads 216 and exposed pads 218 via bonding wires formed within package 210. For example, integrated circuit die 214 may be coupled to leads 216 via respective bonding wires 226 and may be coupled to conductive pads 218 via bonding wires 228. Connected in this way, signals from circuitry external to multi-package unit 200 may be routed to die 214 via wires 226 and signals from circuitry within stacked package 212 may be routed to die 214 via wires 228.

In some arrangements, leads 216 may be directly coupled to conductive pads 218 via bonding wires 230. Connected in this way, signals from circuitry external to multi-package unit 200 may be routed directly to package 212 via path 230. In other arrangements, leads 216 may be directly coupled to center pad 220 via bonding wires 231. Connected in this way, signals from circuitry external to multi-package unit 200 may be routed directly to package 212 via path 231. If desired, exposed center pad 220 may also be directly connected to circuitry at the front side of die 214 via bond wires (not shown in FIG. 2).

Package 212 may be mounted on top of package 210. In particular, control and data signals may be conveyed to and from package 212 via solder connection 222 formed between the bottom of package 212 and the exposed contacts 218 on the top surface of package 210. Solder 224 may be formed between the bottom surface of package 212 and center pad region 220. In one embodiment, solder 224 may be an inactive "dummy" connection that helps dissipate heat for package 212. Solder connection 224 need not be made. In other embodiments, solder 224 may be an active connection that provides a ground power supply voltage, a positive power supply voltage, other power supply voltages, or other suitable control signal(s) to package 212.

Figure 3A:
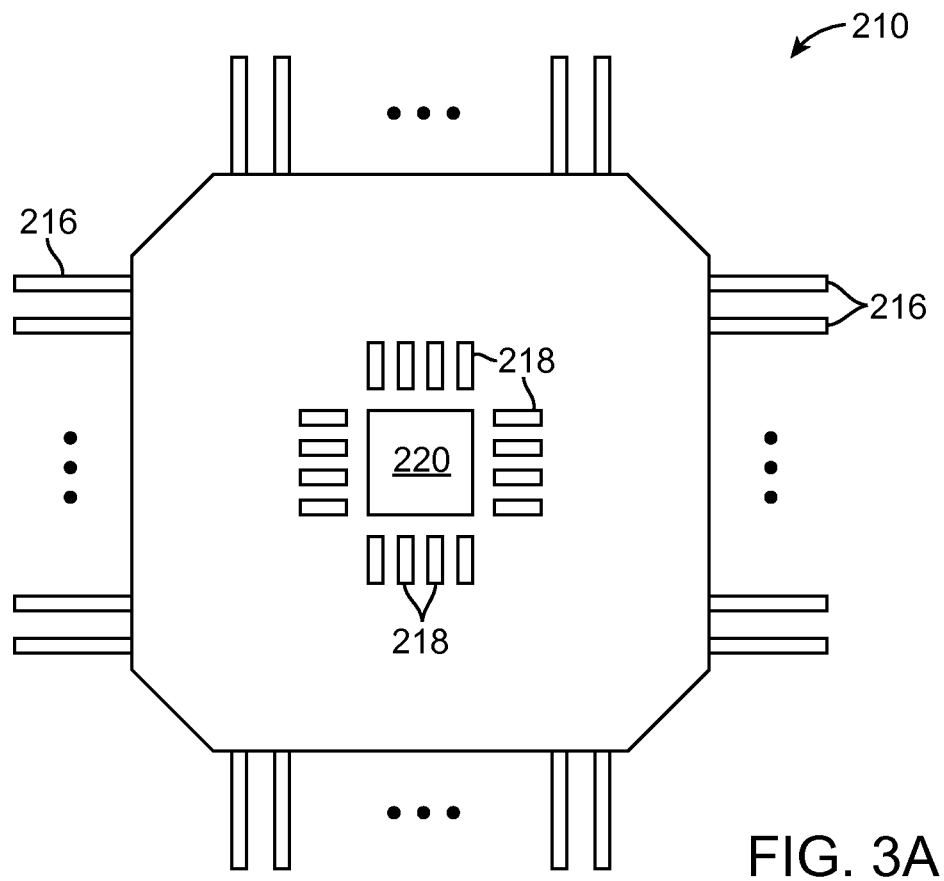
FIG. 3A is a top view of the bottom leadframe package in the multi-package unit of FIG. 2 in accordance with an embodiment of the present invention.

FIG. 3A shows a top view of package 210. As shown in FIG. 3A, leads 216 extend beyond the perimeter of the housing of package 210. The housing of package 210 may, in general, be formed from plastic, ceramic, epoxy, other encapsulation material, or a combination of these materials. FIG. 3A also shows the pattern in which exposed pads 218 and 220 can be formed on the top surface of package 210.

As described above, bottom package 210 may be a QFP. This is merely illustrative and does not serve to limit the scope of the present invention. In another suitable arrangement, bottom package 210 may be a plastic leaded chip carrier (PLCC). A PLCC is similar to a QFP but may have J-shaped metal leads formed at its perimeter. In general, any type of packages that have external leads extending from beyond the package housing (sometimes referred to as "leadframe" packages) and that can have exposed pads formed at the top surface may serve as the bottom package 210 of unit 200 (FIG. 2).

Figure 3B:
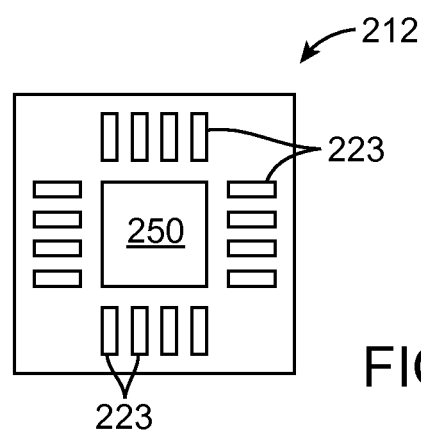
FIG. 3B is a bottom view of the top package in the multi-package unit of FIG. 2 in accordance with an embodiment of the present invention.

FIG. 3B shows the bottom view of package 212. As shown in FIG. 3B, package 212 may have external contacts that matches the exposed contacts on package 210. For example, package 212 may include perimeter contacts 223 configured to make contact with corresponding exposed contact pads 218 and may include a center thermal/ground pad 250 configured to make contact with exposed center region 220.

Package 212 of this type that can be mounted on top of bottom package 210 is sometimes referred to as a quad-flat no-leads (QFN) package. There is merely illustrative. In general, any type of package can be mounted on top of package 210. As examples, a land grid array (LGA) package, a ball grid array (BGA) package, a small outline transistor (SOT) package, a plastic leaded chip carrier (PLCC) package, a quad-flat package (QFP), and other suitable types of surface-mount package can be mounted on top of package 210 as long as the exposed contacts on the top surface of package 210 can accommodate the landing pattern of top package 212. In general, the number of exposed contacts on the top surface of package 210 is at least equal to or more than the number of landing contacts at the bottom surface of package 212. The surface area (or footprint) of package 210 should also be larger than that of package 212 so that package 212 can be properly mounted and supported on top of package 210 (e.g., the footprint the housing of package 210 is at least equal to or larger than the footprint of package 212).

Figure 4:
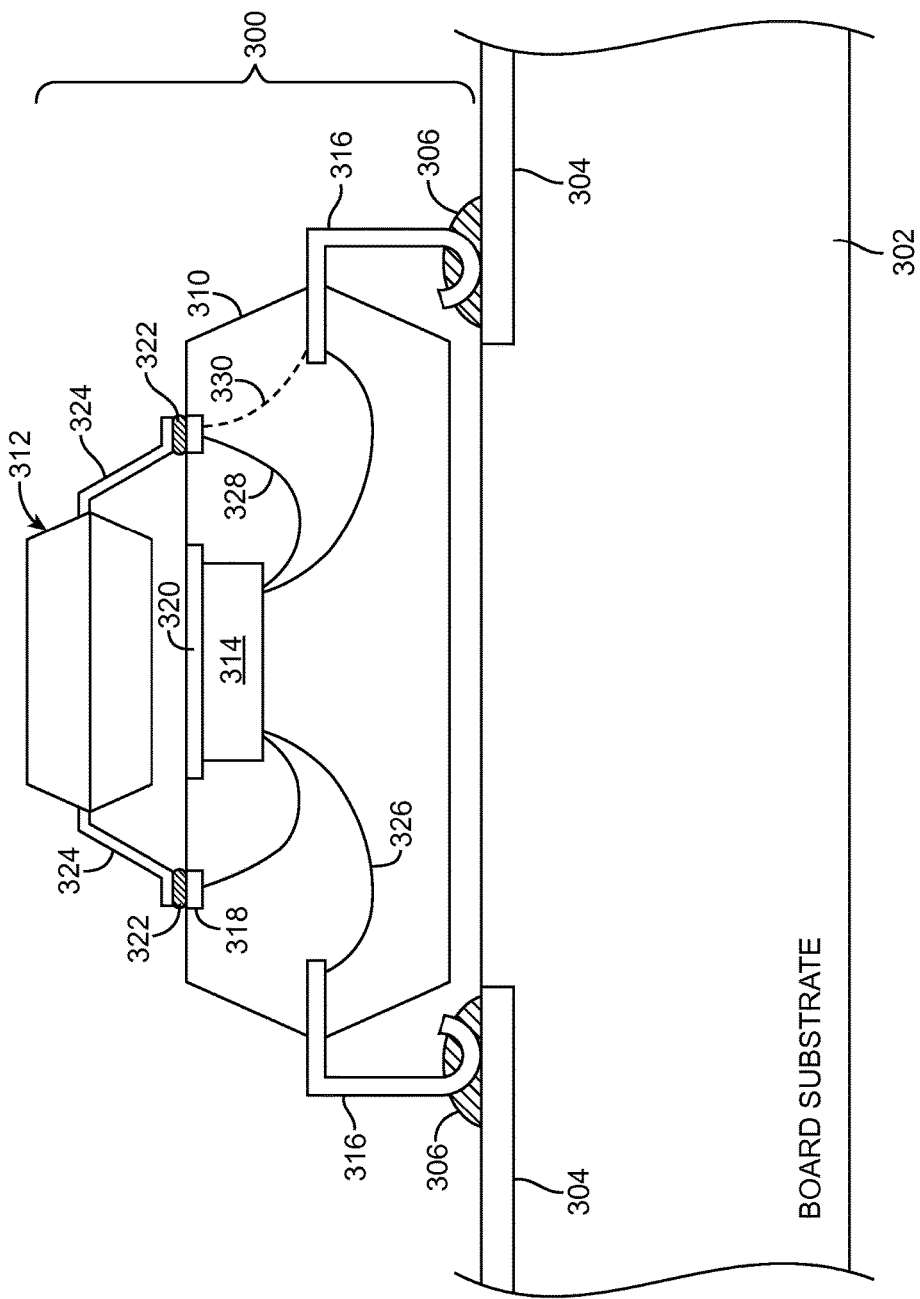
FIG. 4 is a cross-sectional side view of a multi-package unit that includes stacked leadframe packages in accordance with an embodiment of the present invention.

FIG. 4 shows another suitable configuration in which a multi-package unit 300 includes stacked leadframe packages (e.g., unit 300 may include a first package with protruding leads is mounted on a second package with protruding leads). As shown in FIG. 4, multi-package unit 300 may be mounted on a printed circuit board (PCB) 302.

Multi-package unit 300 may include a first (bottom) package 312 and a second (top) package 312 that is stacked on top of bottom package 312. Package 310 may be a type of package sometimes referred to as a plastic leaded chip carrier (PLCC). A PLCC package is a surface mount integrated circuit package that may be provided with J-shaped leads that extend from each of the four sides of the package. In particular, package 310 may include leads 316 that extend from beyond the perimeter of package 310 and that make physical contact with conductive pads 304 formed on PCB 302. Solder material 306 may be formed on pads 304 to ensure proper electrical connection between leads 316 and each of the respective pads 304.

Leads 316 may also have multiple bends so that when leads 316 are in contact with PCB 302, the leads prop package 310 above the surface of the PCB so that the bottom surface of package 310 is not in direct contact with the top surface of the PCB. This is merely illustrative. If desired, the bottom surface of package 310 may be allowed to make direct contact with the surface of PCB 302 for additional mechanical support.

Conductive pads may be formed on the top surface of package 310. In the example of FIG. 4, a center conductive pad 320 and multiple smaller conductive pads 318 surrounding the center conductive pad region 320 may be formed at the upper surface of package 310. Pads 318 and 320 formed in the surface of package 310, which can be used to formed active connections with circuitry mounted on top of package 310, are sometimes referred to as "exposed" contact pads.

An integrated circuit die such as integrated circuit 314 may be formed within package 310. Integrated circuit 314 may be assembled in a wirebond configuration (e.g., the back side of integrated circuit 314 is attached to center conductive region 320, whereas the front side of integrated circuit 314 is coupled to external circuitry via conductive routing paths formed within package 310). Since only the backside of die 314 is in direct contact with pad 320, there is no direct electrical connection between the substrate of die 314 and pad 320.

Circuitry formed in the front side of die 314 may be at least coupled to leads 316 and exposed pads 318 via bonding wires formed within package 310. For example, integrated circuit die 314 may be coupled to leads 316 via respective bonding wires 326 and may be coupled to conductive pads 318 via bonding wires 328. Connected in this way, signals from circuitry external to multi-package unit 300 may be routed to die 314 via wires 326 and signals from circuitry within stacked package 312 may be routed to die 314 via wires 328.

In some arrangements, leads 316 may be directly coupled to conductive signal pads 318 via bonding wires 330. Connected in this way, signals from circuitry external to multi-package unit 300 may be routed directly to top package 312 via path 330. In other arrangements, leads 316 may be directly coupled to center pad 320 via bond wires (not shown). In yet other arrangements, exposed center pad 320 may be directly connected to circuitry at the front side of die 314 via additional bond wires (not shown).

Package 312 may be mounted on top of package 310. In particular, control and data signals may be conveyed to and from package 312 via solder connection 322 formed the exposed contacts 318 on the top surface of package 310 and leads 322 of package 312. In the example of FIG. 4, no direct connection is made between the bottom surface of package 312 and conductive pad 320. If desired, solder or other coupling material may be formed between the bottom surface of package 312 and conductive pad 320 to help with thermal dissipation and/or signal grounding. Package 312 of FIG. 4 is a quad-flat package (as an example). In general, any type of package having leads or without leads may be formed on top of package 310 in unit 300.

Figure 5:
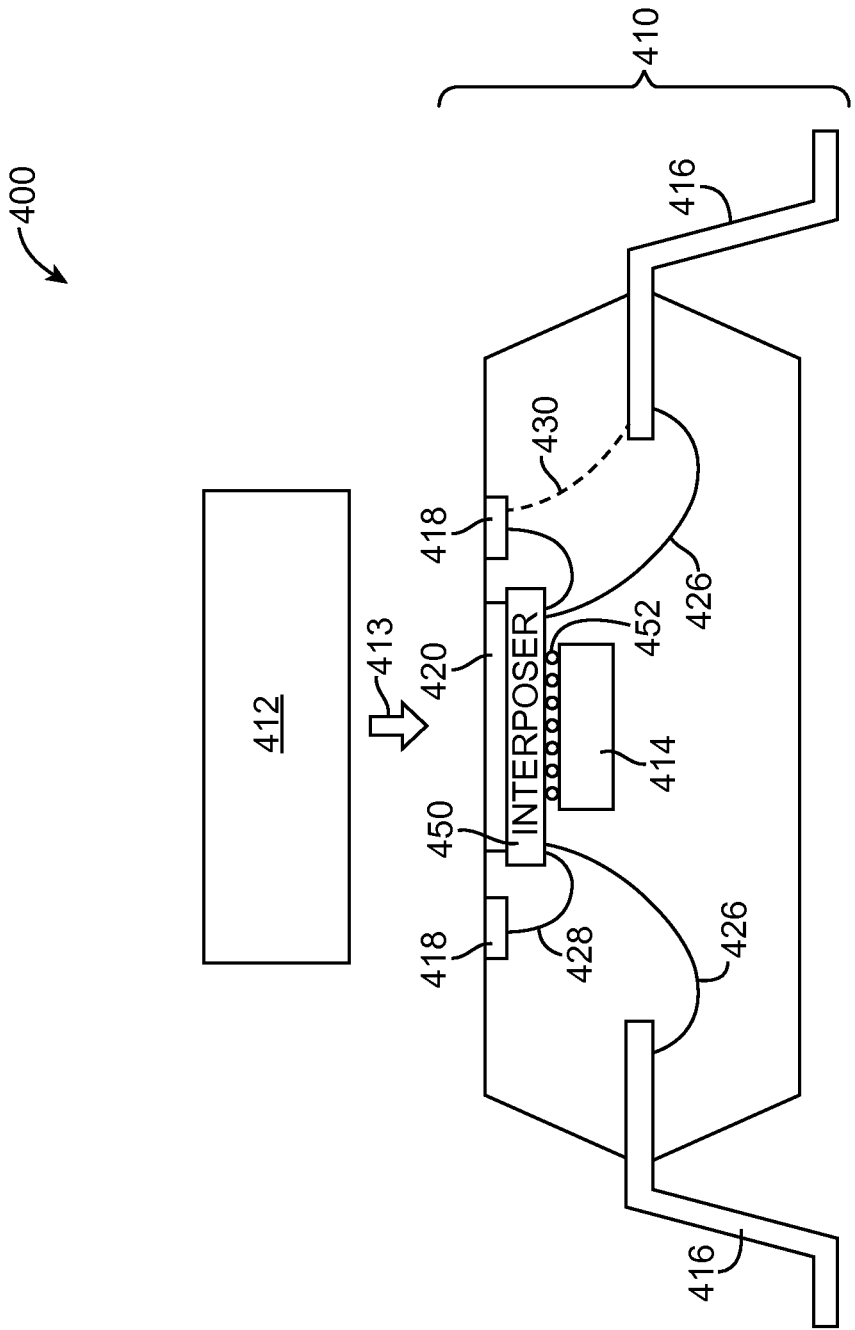
FIG. 5 is a cross-sectional side view showing how the bottom package in a multi-package unit may include an interposer for supporting flip-chip mounting in accordance with an embodiment of the present invention.

The multi-package units 200 and 300 as shown in FIGS. 2 and 4 in which the integrated circuit chip in the bottom stacked package is assembled in the wirebond configuration is merely illustrative and does not serve to limit the scope of the present invention. FIG. 5 shows another suitable embodiment in which a multi-package unit 400 includes a top package 412 mounted on a bottom leadframe package 410 that includes an integrated circuit chip assembled in a flip-chip configuration.

Package 410 of FIG. 5 may be a quad-flat leadframe package (as an example). Package 410 may include gull-wing leads 416 that extend from beyond the perimeter of package 410. Leads 416 may have multiple bends so that when leads 416 are in contact with a PCB, the leads prop package 410 above the surface of the PCB so that the bottom surface of package 410 is not in direct contact with the top surface of the PCB.

Exposed conductive pads may be formed on the top surface of package 410. A center conductive pad region 420 and multiple smaller conductive pads 418 surrounding the center conductive pad 420 may be formed at the top surface of package 410.

An integrated circuit (IC) die such as integrated circuit 414 may be formed within package 410. Integrated circuit 414 may include active circuits such as transistors formed in a substrate and may have a front side and a back side. The front side of integrated circuit 414 represents the side at which transistors and associated interconnect routing paths can be formed, whereas the back side of integrated circuit 414 represents the side of the substrate. Integrated circuit 414 may be assembled in a flip-chip configuration in which the front side of integrated circuit 414 is attached to an interposer structure 450 formed within package 410. Interposer 450 may have a first surface that is attached to center conductive region 420 and a second opposing surface that is coupled to the front side of die 414 via solder bumps 452 (e.g., microbumps 452). Assembled in this way, circuitry external to package 410 may communicate with die 414 via interposer 450.

Interposer 450 may be least coupled to leads 416 and exposed pads 418 via bonding wires formed within package 410. For example, interposer 450 may be coupled to leads 416 via respective bonding wires 426 and may be coupled to conductive pads 418 via bonding wires 428. Connected in this way, signals from circuitry external to multi-package unit 400 may be routed to die 414 via wires 426 and interposer 450 and signals from circuitry within stacked package 412 may be routed to die 414 via wires 428 and interposer 450.

In some embodiments, leads 416 may be directly coupled to conductive pads 418 via bonding wires 430. Connected in this way, signals from circuitry external to multi-package unit 400 may be routed directly to package 412 via path 430. If desired, exposed center pad 420 may also be directly connected to circuitry at the front side of die 414 via interconnect routing paths formed within interposer 450.

In general, package 412 can be any type of package that can be mounted on top of package 410. As examples, a land grid array (LGA) package, a ball grid array (BGA) package, a small outline transistor (SOT) package, a plastic leaded chip carrier (PLCC) package, a quad-flat package (QFP), and other suitable types of surface-mount package can be mounted on top of package 410 as long as the exposed contacts on the top surface of package 410 can accommodate the landing pattern of top package 412 (e.g., the surface area or footprint of package 410 should be at least equal to or larger than that of package 412 so that package 412 can be properly mounted and supported on top of package 410.

Figure 6:
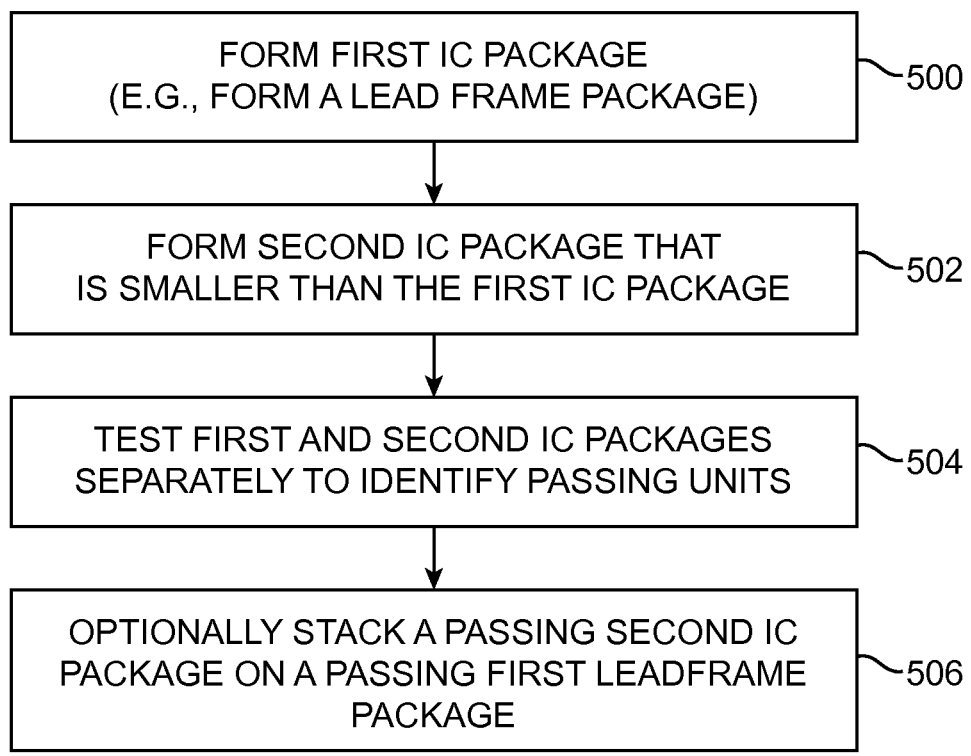
FIG. 6 is a flow chart of illustrative steps for manufacturing a multi-package unit that includes at least one leadframe package in accordance with an embodiment of the present invention.

FIG. 6 shows a flow chart of illustrative steps involved in manufacturing a multi-package module. At step 500, a first IC package (e.g., a leadframe package having conductive leads protruding from beyond the perimeter of the package housing) may be formed. At step 502, a second IC packaged that is smaller than the first IC package may be formed.

Forming the first and second packages separately may allow the die in each of the stacked packages to be implemented using the most appropriate technology process, may increase the performance of die-to-die interface, and may help simplify PCB design (i.e., the design of the PCB on which the multi-package unit is mounted during normal system operation). As an example, the bottom package may include an application-specific integrated circuit implemented using a first technology node, whereas the top package may include a voltage regulating circuit (e.g., a DC-DC voltage converter for supplying regulated voltages to the programmable integrated circuit) implemented using a second technology node. As another example, the bottom package may include a programmable integrated circuit implemented using the 28 nm CMOS technology node, whereas the top package may include a memory chip implemented using the 45 nm CMOS technology node.

At step 504, the first and second IC packages may be tested separately to check whether each of the IC packages satisfy design criteria (e.g., to determine whether the circuits within each of the packages are operating satisfactorily and to determine whether each of the packages exhibit any manufacturing defects).

At step 506, a passing second IC package may be mounted on top of a passing first leadframe package to form a multi-package unit. Desired solder connections can then be made to ensure proper electrical connections between each of the stacked dies within the multi-package unit (e.g., to coupled the exposed pads on the top surface of the first leadframe package to contact leads/pads associated with the second IC package). If desired, epoxy, resin, or other molding/encapsulation material may be disposed over the multi-package unit to seal the stacked packages from external contaminants.

The steps describes in connection with FIG. 6 are merely illustrative. If desired, the steps may be performed in any suitable order and other steps may be performed in between the described operations.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. Circuitry, comprising:
   a substrate;
   a first integrated circuit package formed on the substrate, wherein the first integrated circuit package comprises a leadframe package, and wherein the first integrated circuit package includes contact pads formed in a top surface of the first integrated circuit package;
   a second integrated circuit package that is formed separately from the first integrated circuit package and that is stacked on the top surface of the first integrated circuit package, wherein the second integrated circuit package comprises another leadframe package having leads that directly contact the contact pads of the first integrated circuit package, and wherein the first integrated circuit package includes an integrated circuit die having a first surface that faces the substrate and a second surface that faces the second integrated circuit package; and
   bonding wires attached to the first surface of the integrated circuit die.

2. The circuitry defined in claim 1, wherein the first integrated circuit package includes protruding leads.

3. The circuitry defined in claim 2, wherein the leads extend beyond the perimeter of the first package.

4. The circuitry defined in claim 2, wherein the substrate comprises a printed circuit board.

5. The circuitry defined in claim 2, wherein the first integrated circuit package includes an integrated circuit die mounted in a wirebond configuration.

6. The circuitry defined in claim 2, wherein the first integrated circuit package includes an integrated circuit die mounted in a flip-chip configuration.

7. The circuitry defined in claim 2, wherein the first integrated circuit package has a first footprint, and wherein the second integrated circuit package has a second footprint that is smaller than the first footprint.

8. A multi-package unit, comprising:
   a first package; and
   a second package that is formed separately from the first package and that is mounted on a surface of the first package, wherein the first package includes contact pads formed in the surface of the first package, leads, and conductive paths coupling the contact pads directly to the leads.

9. The multi-package unit defined in claim 8, wherein the first package includes an integrated circuit die that is coupled to the contact pads via first respective wires and that is coupled to the leads via second respective wires.

10. The multi-package unit defined in claim 9, wherein the integrated circuit die is mounted in a flip-chip configuration within the first package.

11. The multi-package unit defined in claim 10, wherein the first package includes an interposer coupled between the integrated circuit die and the surface of the first package.

12. The multi-package unit defined in claim 11, wherein an integrated circuit die in the second package communicates with the integrated circuit die in the first package via the interposer.

13. Circuitry, comprising:
   a substrate;
   a first integrated circuit package formed on the substrate, wherein the first integrated circuit package comprises a leadframe package, and wherein the first integrated circuit package includes contact pads formed in a top surface of the first integrated circuit package;
   a second integrated circuit package that is formed separately from the first integrated circuit package and that is stacked on the top surface of the first integrated circuit package, wherein the second integrated circuit package comprises a flip-chip package having external bumps that directly contact the contact pads of the first integrated circuit package, and wherein the first integrated circuit package includes an integrated circuit die having a first surface that faces the substrate and a second surface that faces the second integrated circuit package; and
   bonding wires attached to the first surface of the integrated circuit die.

\* \* \* \* \*